US006765397B2

(12) United States Patent
Corbin, Jr. et al.

(10) Patent No.: US 6,765,397 B2
(45) Date of Patent: Jul. 20, 2004

(54) APPARATUS AND METHOD FOR TESTING LAND GRID ARRAY MODULES

(75) Inventors: John S. Corbin, Jr., Austin, TX (US); Jose A. Garza, Pflugerville, TX (US); Howard V. Mahaney, Jr., Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 10/302,495

(22) Filed: Nov. 21, 2002

(65) Prior Publication Data

US 2004/0113638 A1 Jun. 17, 2004

(51) Int. Cl.[7] .............................................. G01R 31/02
(52) U.S. Cl. ..................... 324/754; 324/158.1
(58) Field of Search ............................. 324/765, 158.1, 324/755, 756; 439/331, 325; 361/719, 820

(56) References Cited

U.S. PATENT DOCUMENTS

| 5,177,436 | A | * | 1/1993 | Lee | ............................. | 324/754 |
| 5,461,326 | A | * | 10/1995 | Woith et al. | ................. | 324/758 |
| 5,493,237 | A | * | 2/1996 | Volz et al. | ................... | 324/754 |
| 5,523,696 | A | * | 6/1996 | Charlton et al. | ............ | 324/758 |
| 6,061,235 | A | * | 5/2000 | Cromwell et al. | .......... | 361/690 |

OTHER PUBLICATIONS

U.S. patent application Ser. No. 09/892,967, filed Jun. 27, 2001.
U.S. patent application Ser. No. 09/931,299, filed Aug. 16, 2001.
U.S. patent application Ser. No. 10/007,028, filed Nov. 05, 2001.

* cited by examiner

Primary Examiner—Evan Pert
Assistant Examiner—Tung X. Nguyen
(74) Attorney, Agent, or Firm—Cardinal Law Group; Casimer K. Salys (57) ABSTRACT

An apparatus and method are provided for effectively and efficiently testing or burning-in land grid array (LGA) modules, through the use of a self-aligning clamping device for clamping the LGA against a circuit card. The self-aligning clamping device includes a clamping body having an LGA contact surface adapted for bearing against the LGA module, and a pivot element for receiving a clamping force from a ram element selectively movable along a ram axis oriented generally normal to the array of electrical test contacts on the circuit card and transferring the clamping force to the clamping body. The clamping body is also a heat exchanger for maintaining the LGA module at a desired operating temperature during test or burn-in.

20 Claims, 5 Drawing Sheets

APPARATUS AND METHOD FOR TESTING LAND GRID ARRAY MODULES

TECHNICAL FIELD OF THE INVENTION

This invention relates to electrical components packaged in land grid array (LGA) modules, and more particularly to an apparatus and method for performing electrical testing of LGA modules.

BACKGROUND OF THE INVENTION

The actual working elements of modern electronic and electrical devices often take the form of small electronic chips, that are mounted individually, or with other chips, inside of a module having a closed housing that protects the chips from environmental damage, and provides input/output connections to a circuit incorporating the module.

Figure 1A:
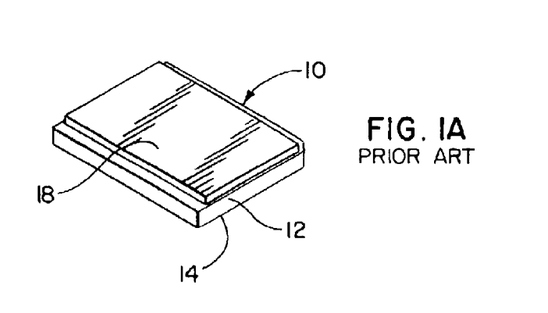
FIG. 1A is a perspective view of a land grid array (LGA) module of a type that can be tested according to our invention.
Figure 1B:
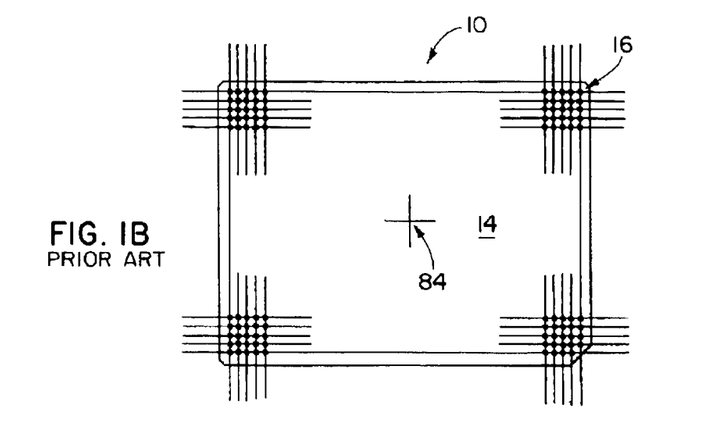
FIG. 1B is a bottom view of the LGA module of FIG. 1, showing a potion of the LGA electrical contacts located on a bottom surface of the LGA module.

One commonly used type of module, known as a land grid array (LGA) module, is shown in FIGS. 1A and 1B. The LGA module 10 of FIGS. 1A and 1B includes a housing, having a substrate 12 and a cover 18. The substrate 12 has an upper surface for receiving the chips, and a bottom, flat, planar surface 14 having plurality of LGA electrical contacts 16 arranged in an array as shown in FIG. 1B. Such LGA modules 10 may include more than one thousand LGA electrical contacts 16. The top of the substrate 12 is closed, or "capped" by joining the cover 18 to the substrate 12 with an adhesive or solder. The cover 18 includes recesses for the chips on the side of the cover 19 joined to the substrate 12

Figure 2A:
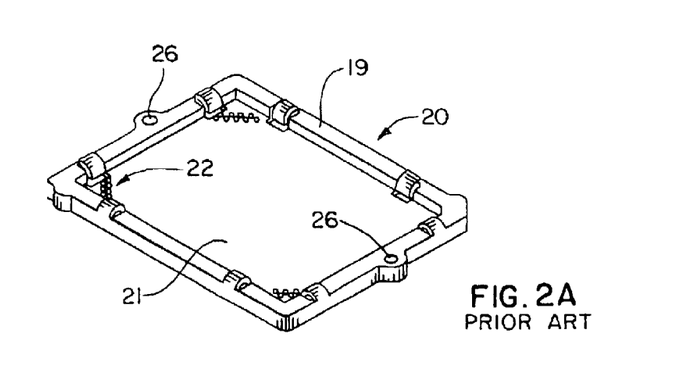
FIG. 2A is a perspective view of an interposer of a type that can be used in conjunction with our invention.
Figure 2B:
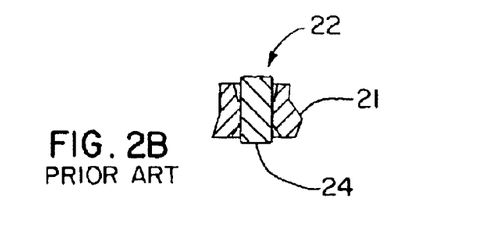
FIG. 2B is an enlarged partial cross sectional view of an electrical contact of the interposer of FIG. 2A.

Such LGA modules 10 are typically connected to a circuit card having an array of electrical contacts corresponding to at least a portion of the LGA electrical contacts, by positioning a device known as an interposer 20, as shown in FIGS. 2A and 2B, between the LGA module 10 and the circuit card, and clamping the LGA module 10 and interposer 20 to the circuit card. There are several types of interposers 20 that are typically used for this purpose.

One commonly used type of interposer 20 includes a molded body having a raised frame 19 surrounding a flat planar surface 21 that includes an array of through holes 22. The through holes 22 are aligned with the arrays of LGA electrical contacts 16 on the LGA module 10 and circuit card, and with respect to a pair of location holes 26 passing through the raised frame 29. As shown in FIG. 2B, each hole 22 in the interposer 20 includes a compressible electrically conductive element 24, such as a pad of kinked small diameter wire, a C-spring that is compressed when the LGA module 10 is clamped to the circuit card, to provide electrical contact between the LGA electrical contacts 16 and the circuit card.

In a second type of commonly used interposer 20, the flat planar surface 21 of the interposer 20 is provided by a thin sheet of electrically insulative material, such as a polyimide, that is attached to the raised frame 19. The sheet of polyimide material includes through holes 22 aligned with the arrays of LGA electrical contacts 16 on the LGA module 10 and circuit card, and with respect to a pair of location holes 26 passing through the raised frame 29, in the same manner as described above with respect to an interposer 20 having a molded body. In the second type of interposer, however, each hole includes a compressible electrically conductive element 24 formed from a conductive elastomeric material, such as a silver-filled silicone.

The clamping force for holding the LGA module 10 against the circuit card is typically provided by a clamping device having a number of metal plates, stiffeners, tension posts, and a spring element, all held together by one or more screws, in a relationship that applies a clamping force to the LGA module 10. The clamping device may also include a heat exchanger for dissipating heat generated during operation of the LGA module. These clamping devices are often complex in nature to ensure that the clamping pressure is applied uniformly to the LGA module 10, for optimal electrical contact with the circuit card and optimal thermal transfer to the heat exchanger.

The electrical performance of LGA modules varies somewhat from module to module, due to slight variations in the performance of the chips, and factors relating to the installation of the chips in the modules that cannot be controlled during fabrication of the module. As is the case in many electronic components, an initial burn in period is also required in some instances to screen out certain defective modules and ensure that the completed modules will not fail prematurely. As a result, it is often necessary to test completed LGA modules prior to installing them into a circuit to determine their individual performance, or to burn in the modules at various operating voltages, clock speeds, and power levels, while the module is operating in a known temperature range.

It is desirable that an apparatus and method for testing the LGA modules be capable of closely emulating the physical mounting arrangement that will be used for attaching the LGA module to a circuit card during actual use of the module. While it would appear to be desirable to utilize the actual clamping hardware for testing the module, i.e. the hardware that will be used for mounting the LGA module on a circuit card in an electronic device, such hardware is typically not capable of being conveniently and repeatedly installed and removed in the manner that would be required for the mounting hardware to function as a test apparatus. Such hardware is typically designed to be so compact and light weight that it does not lend itself well to repeatedly establishing clamping and electrical connection conditions that are uniform enough, from module to module, to serve as a basis for testing.

In addition, a typical set of clamping hardware does not include a heat exchanging device that is sophisticated enough to allow testing of the module under a variety of environmental temperature conditions. The heat sinks used in such clamping arrangements are generally designed to operate only in the specific application and operating environment that the module will encounter during actual operation, and do not allow the module to be tested at higher or lower operating temperatures.

In a test apparatus, it is highly desirable to rapidly apply a clamping force to the cover 18 of the LGA module during testing, for clamping the LGA module against a circuit card, with a device such as an air or hydraulic cylinder or an arbor press, having a ram element that can be quickly moved along a one dimensional axis. Unfortunately, the upper surface of the cover 18 is typically not parallel to the bottom, flat, planar surface 14 of LGA module and the electrical contacts 16. If a one dimensional force is applied directly to the cover 18, using the ram element, the LGA electrical contacts 16 will not be clamped with uniform force against the circuit card. If the contacts 16 are not clamped with a uniform force, the electrical conductivity of the contacts 16 will not be uniform or representative of what will be achieved in service, thereby introducing an unacceptable variable into the test results. Also, if the upper surface of the cover 18 is tilted slightly with respect to the lower surface of the LGA module 10, good thermal contact will not be achieved between a heat exchanger clamped against the cover 18 by the ram element, thereby making it difficult to precisely control temperature of the LGA module 10 during testing and burn-in of the module.

What is needed is an apparatus and method for effectively and efficiently testing and burning-in LGA modules.

SUMMARY OF THE INVENTION

Our invention provides an apparatus and method for effectively and efficiently testing land grid array (LGA) modules in a mounting arrangement that closely matches the actual mounting arrangement that will be used for attaching the LGA modules to a circuit card, through the use of a self-aligning clamping device for clamping the LGA against a circuit card. The self-aligning clamping device includes a clamping body having an LGA contact surface adapted for bearing against the LGA module, and a pivot element for receiving a clamping force from a ram element selectively movable along a ram axis oriented generally normal to the array of electrical test contacts on the circuit card and transferring the clamping force to the clamping body. The clamping body may also be a heat exchanger for maintaining the LGA module at a desired operating temperature during test or burn-in.

In one form of our invention, an apparatus is provided for testing an (LGA) module having a flat planar mounting surface including a plurality of LGA electrical contacts arranged in an array. The apparatus includes a support frame, a circuit card, a ram element, and a self-aligning clamping device. The circuit card has a flat planar surface attached to the support frame and having an array of electrical test contacts corresponding to a portion of the array of LGA electrical contacts disposed on the planar surface. The ram element is operatively attached to the support frame for selectively applying a clamping force through reciprocating movement of the ram element along a ram axis oriented generally normal to the array of electrical contacts on the flat planar surface of the circuit card. The self-aligning clamping device includes a clamping body having an LGA contact surface adapted for bearing against the LGA module, and a pivot element operatively attached to the ram element for receiving the clamping force and transferring the clamping force to the clamping body. The pivot element may provide a single point of contact for transferring the clamping force to the clamping body. The pivot element may apply the clamping force along a primary line of force that is directed through a centroid defined by the LGA electrical contacts.

The apparatus may include an interposer positioned on the circuit card for receiving the LGA module. By using the same type of interposer in the test apparatus that will be used for attaching the LGA module to a circuit card when the module is placed into actual service, the electrical contact conditions established during testing closely approximates the conditions that will be established when the module is attached to a circuit card and placed into service. The apparatus may include an LGA socket retention frame for positioning the interposer and LGA module on the circuit card, so that the interposer can be conveniently replaced from time-to-time during testing quantities of the modules.

The apparatus may include a force generating device, such as an air or hydraulic cylinder, or an arbor press, operatively connected through the ram element to the pivot element for applying the clamping force to the clamping body. The clamping body may also be a heat exchanger for exchanging heat with the LGA module.

To facilitate achieving a uniform clamping force applied to the LGA module, the self-aligning clamping device may bring the LGA contact surface of the clamping body to bear against the LGA module and align the LGA contact surface with the LGA module prior to the clamping body receiving and transferring the clamping force to the LGA module.

The self-aligning clamping device may include a suspension plate adapted for receiving the clamping force, and having a first pivot element extending therefrom. A second pivot element is attached to the clamping body. One or more suspension posts slidingly connect the clamping body to the suspension plate in a spaced relationship therewith in a manner allowing angular movement over a predetermined range of the clamping body with respect to the suspension plate. One or more spring elements may be operatively connected between the suspension plate and clamping body for maintaining the spaced relationship while allowing angular movement within the predetermined range between the clamping body and suspension plate. The first pivot element may have a convex spherical shape, and the second pivot element may be a flat plate.

Our invention may also take the form of method for testing an LGA module by positioning the LGA module on a circuit card having an array of electrical test contacts corresponding to a portion of the array of LGA electrical contacts, and clamping the LGA module against the circuit card with a self-aligning clamping device including a clamping body having an LGA contact surface adapted for bearing against the LGA module, and a pivot element for receiving a clamping force from a ram element selectively movable along a ram axis oriented generally normal to the array of electrical test contacts on the circuit card and transferring the clamping force to the clamping body.

The foregoing and other features and advantages of our invention are apparent from the following detailed description of exemplary embodiments, read in conjunction with the accompanying drawings. The detailed description and drawings are merely illustrative of our invention rather than limiting, the scope of our invention being defined by the appended claims and equivalents thereof.

DETAILED DESCRIPTION

Figure 3:
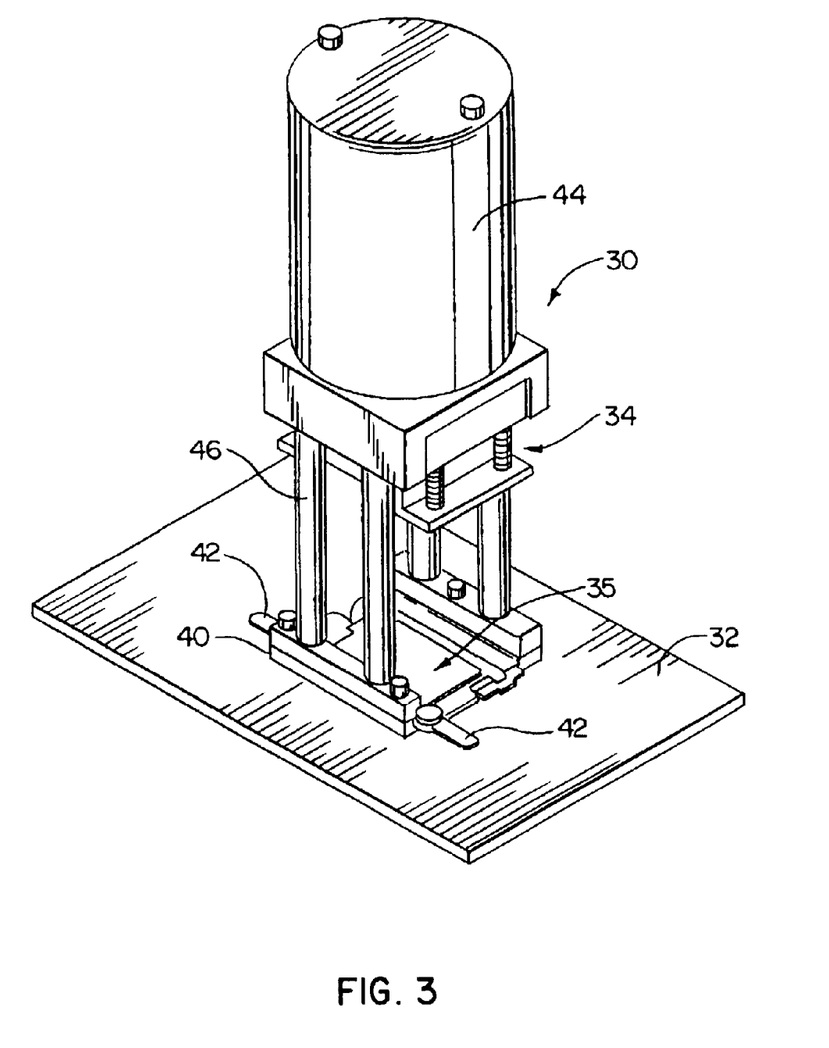
FIG. 3 is perspective view of an apparatus, according to our invention, for testing LGA modules of the type shown in FIG. 1.

FIG. 3 shows an exemplary embodiment of our invention in the form of a test apparatus 30 for testing a land grid array (LGA) module 10, as shown in FIGS. 1A and 1B, having a flat planar mounting surface 14 including a plurality of LGA electrical contacts 16 arranged in an array.

Figure 4:
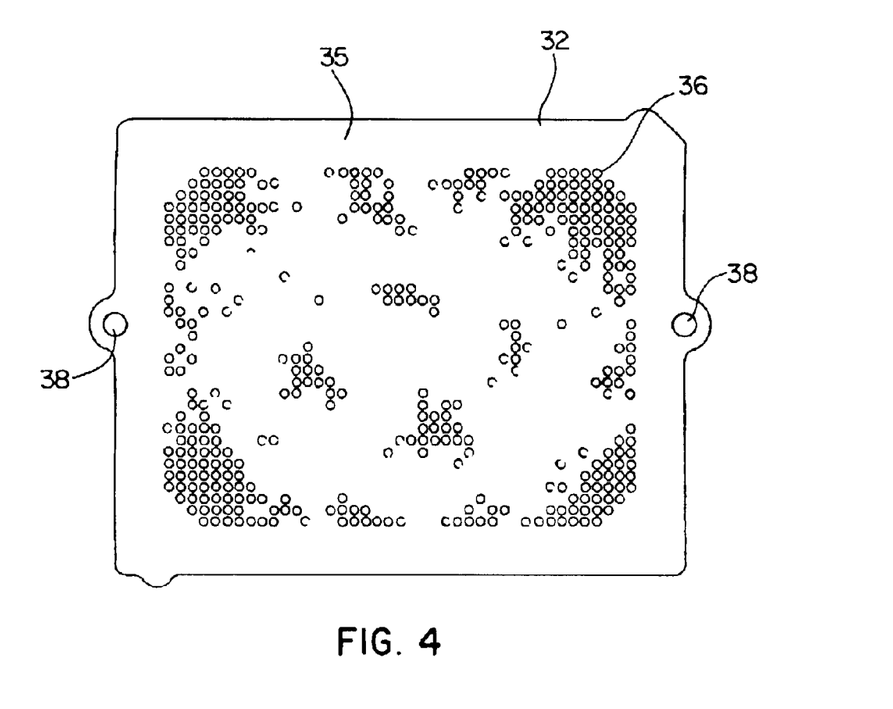
FIG. 4 is a view showing an array of electrical contacts and locating holes on a circuit board of the apparatus of FIG. 3.

The test apparatus 30 includes a circuit card 32 and a self-aligning clamping device 34 for clamping the LGA module 10 against the circuit card 32. The circuit card 32 has a flat planar surface 35, and an array of electrical test contacts 36 disposed on the surface 35 of the circuit card, as shown in FIG. 4, corresponding to a portion of the array of LGA electrical contacts 16, and a pair of alignment holes 38.

The test apparatus 30 also includes an LGA socket retention frame 40 attached to the flat planar surface 35 of the circuit card 32, for positioning an interposer 20 of the type shown in FIGS. 2A and 2B, and an LGA module 10 on the circuit card 32. The LGA socket retention frame 40 includes a pair of latches 42 for retaining the interposer 20 in the frame 40.

Figure 6:
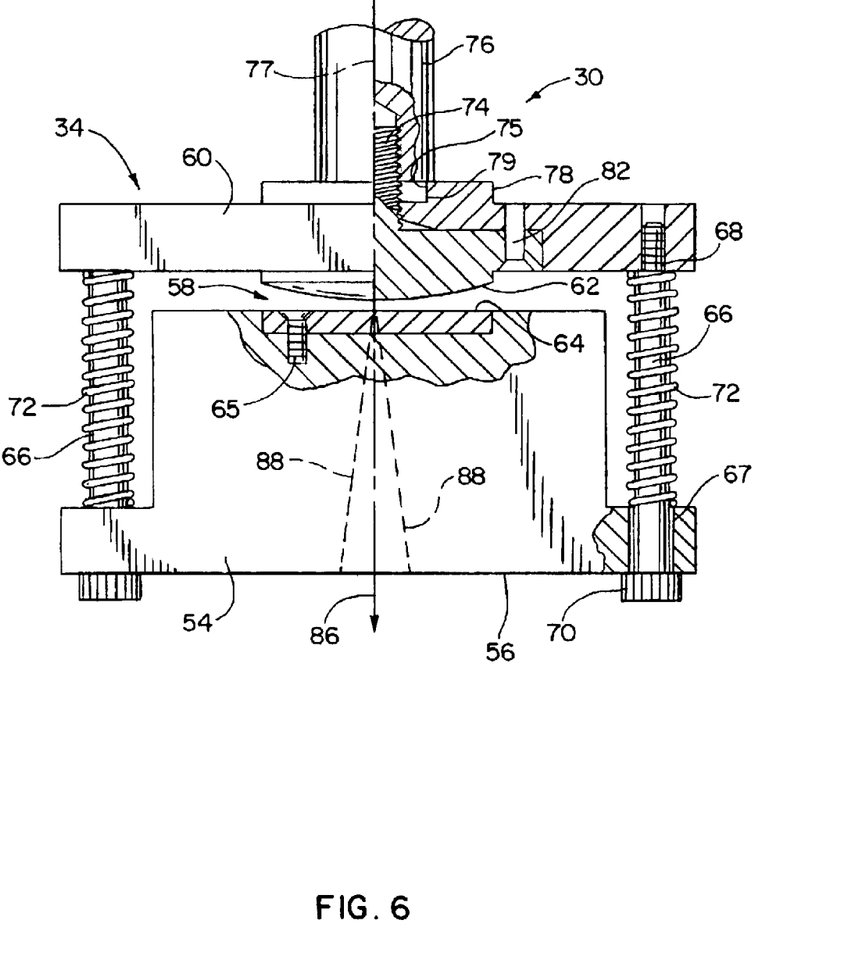
FIG. 6 is an enlarged view of an upper portion of the apparatus of FIG. 3, showing a self-aligning clamping apparatus for clamping an LGA module against a circuit card during testing of the LGA module.

The test apparatus 30 further includes a force generating device, in the form of an air cylinder 44 mounted on a support/guide frame 46 attached to the socket retention frame 40. The air cylinder 44 includes a ram element, in the form of a piston rod 76, as shown in FIG. 6. The piston rod 76 is operatively attached through the air cylinder 44 to the support frame 46 for selectively applying a clamping force through reciprocating movement of the piston rod 76 along a ram axis 77, as shown in FIG. 6, oriented generally normal to the array of electrical contacts 36 on the flat planar surface 35 of the circuit card 32.

Figure 5:
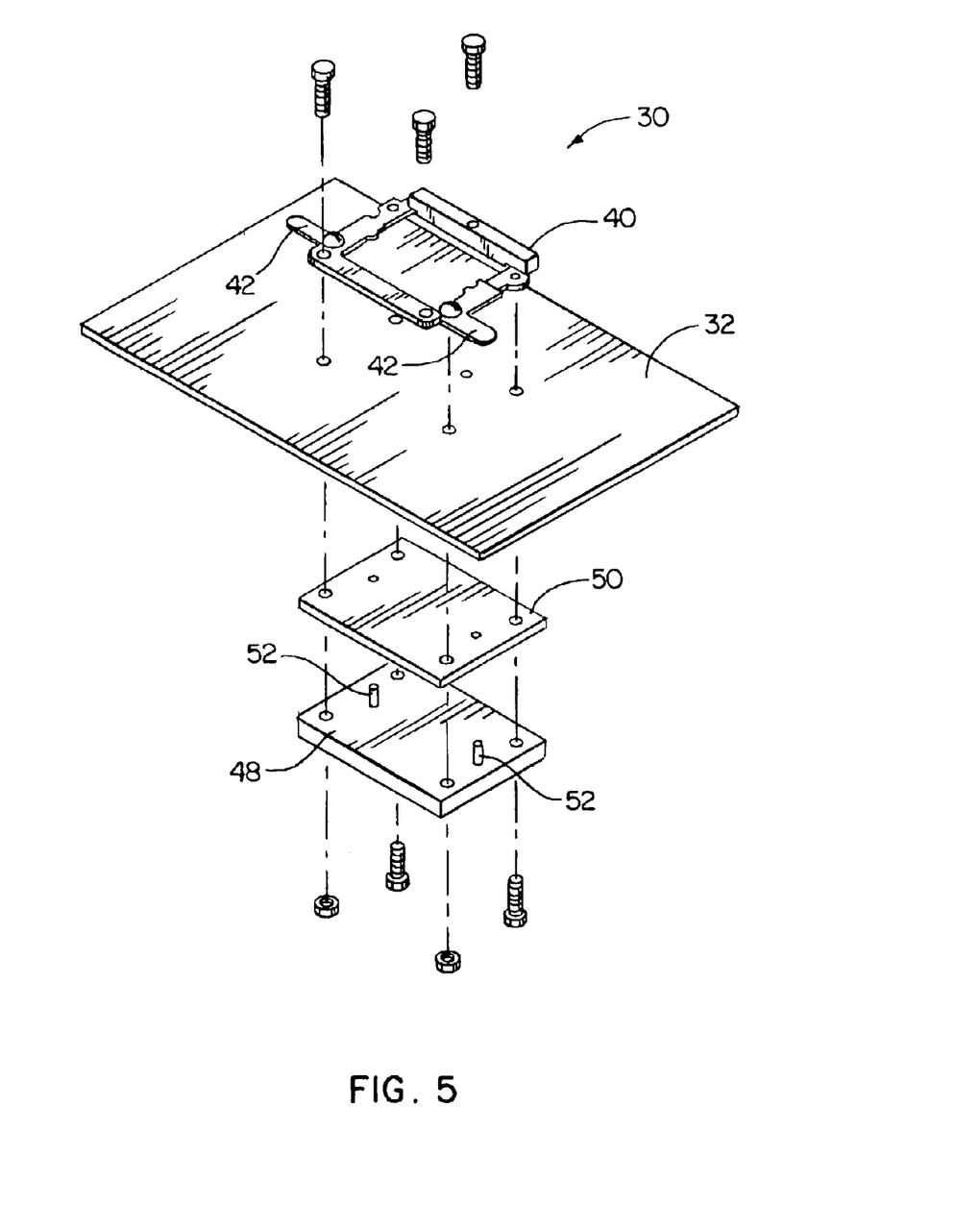
FIG. 5 is an exploded perspective view of a lower portion of the apparatus of FIG. 3.

As shown in FIG. 5, the test apparatus 30 still further includes a backside stiffener 48 separated by an electrical insulator 50 from the bottom side of the circuit card 32. A pair of alignment pins 52, extend upward from the backside stiffener 48, through the insulator 50 and the circuit card 32, for engaging the location holes 26 in the interposer 20.

As shown in FIG. 6, the self-aligning clamping device 34 includes a clamping body 54 having an LGA contact surface 56 adapted for bearing against the LGA module 10, and a pivot element 58 for receiving a clamping force and transferring the clamping force to the clamping body 54. The self-aligning clamping device 34 further includes a suspension plate 60, adapted for receiving the clamping force.

In the exemplary embodiment, the pivot element 58 includes a first pivot element 62 extending from the suspension plate 60, and a mating second pivot element 64 attached by one or more screws 65 to the upper surface of the clamping body 54.

The lower surface of the first pivot element 62 has a convex spherical shape, and the second pivot element 64 is a flat plate, so that when the first and second pivot elements 62, 64 are in contact with one another, the pivot element 58 provides a single point of contact along the spherical surface of the first pivot element 62, for transferring the clamping force to the clamping body 54. The first and second pivot elements 62, 64 are preferably made from a material such as hardened steel, and the radius of the spherical surface is judiciously selected so that the Hertzian contact stresses will be low enough that the first and second pivot elements 62, 64 will not be plastically deformed or otherwise damaged during operation of the test apparatus 30.

The clamping body 54 is slidingly connected in a spaced relationship to the suspension plate 60 by four suspension posts, in the form of shouldered bolts 66, that pass through clearance holes 67 in the clamping body 54. The bolts 66 each include a shoulder 68 that bears against the lower surface of the suspension plate 60, and a head 70 that bears against the lower surface of the clamping body 54. The shoulder 68 and head 70 of the suspension bolts 66 are spaced such that the first and second pivot elements 62, 64 are spaced slightly apart from one another when the clamping plate 54 is resting on the heads 70 of the bolts 66, as shown in FIG. 6.

Four spring elements, in the form of helical compression springs 72, one disposed around each shouldered bolt 66, are compressed between the suspension plate 60 and clamping body 54. These springs 72, in combination with the clearance holes 67 maintain the spaced relationship between the clamping body 54 and suspension plate 60, and allow limited angular movement within a predetermined range between the clamping body 54 and suspension plate 60. Preferably, the springs 72 have a relatively low spring rate, and are initially compressed significantly between the clamping body 54 and suspension plate 60, with the first and second pivot elements 62, 64 spaced slightly apart from one another when the clamping plate 54 is resting on the heads 70 of the bolts 66, as shown in FIG. 6. Using springs 72 with a low spring rate and a high degree of initial compression provides a combined spring force between the clamping body 54 and suspension plate 6d that remains relatively constant as the lower surface 56 of the clamping body 54 aligns itself with the cover 18 of the LGA module 10 under test The self-aligning clamping apparatus 34 is suspended by a bolt 74 from the lower end of a piston rod 76 extending from the air cylinder 44. The piston rod 76 is preferably restrained against rotation about the ram axis 77, by features of the air cylinder 44. It is desirable to restrain the piston rod 76 against rotation to have the clamping body 54 contact the LGA module in a precisely controlled and repeatable angular position to keep the clamping force and heat transfer contact area as uniform as possible between the modules being tested. In other embodiments of our invention, it may desirable to have the clamping body 54 operatively connected in some other way to the support frame 46, for restraining the clamping body 54 against rotation.

In the exemplary embodiment, the piston rod 76 is cylindrical. The end of the piston rod 76 includes one or more flats 79, and engages a correspondingly shaped internal bore 75 in a boss 78 extending upward from the suspension plate 60. The flats 79 key the support plate 60 to the piston rod 76, to thereby restrain the suspension plate 60 against rotation with respect to the piston rod 76. The first pivot element 62 is secured, in a counter-bore 80 of the suspension plate 60, by one or more retention screws 82.

It is preferred that the clamping body 54 be a heat exchanger, including internal fluid passages (not shown) for circulating a cooling or heating fluid, to precisely maintain the LGA module 10 under test at a desired operating temperature.

To test or burn in an LGA module 10, an interposer 20 is inserted into the LGA socket retention frame 40, with the location holes 26 in the interposer engaging the alignment pins 52 extending through the circuit card 32, and locked into position by the latches 42. The LGA module 10 is then inserted into the interposer 20, with the cover 18 of the LGA facing up toward the self-aligning clamping device 34. The air cylinder 44 is then activated to cause the piston rod 76 to move downward and bring the lower surface 56 of the clamping body 54 into contact with the cover 18 of the LGA module 10.

When the lower surface 56 of the clamping body 54 first contacts the cover 18, the springs 72 will maintain the slight spacing between the first and second pivot elements 62, 64.

The springs 72, in conjunction with the clearance holes 67 in the clamping body 54, allow the clamping body 54 to pivot slightly to bring the lower surface 56 of the clamping body 54 into alignment with the upper surface of the cover 18 of the LGA module 10.

As the piston rod 76 continues to move downward, the springs 72 are compressed to a point where the spherical surface of the first pivot element 62 is brought into contact with the second pivot element 64. Further downward movement of the piston rod 76 applies a clamping force to the LGA module 10 for clamping the LGA module 10 and interposer 20 uniformly against the circuit card 32 to establish electrical contact between the circuit card 32 and the LGA module 10. The spherical surface of the first pivot element 62 allows the air cylinder 44 to apply the clamping force to the clamping body 54 through the second pivot element 64 at a single point of contact. The single point of contact allows the clamping force to be transmitted to the LGA module 10 without disturbing the alignment of the lower surface 56 of the clamping body 54 with the top surface of the cover 18 of the LGA module 10.

Preferably, where the array of LGA electrical contacts 16 are uniformly spaced around a central point, known as a centroid 84 of the array of LGA electrical contacts, as shown in FIG. 1B, the spherical surface of the first pivot element 62 allows the pivot element 58 to apply the clamping force along a primary line of force 86, as shown in FIG. 6, that is directed through the centroid 84. The pivot element 58 allows the primary line of force 86 to act within a conical area indicated by dashed lines 88 in FIG. 6, and stay aligned with the centroid 84, as the lower surface 56 of the clamping body 54 pivots to align with the top surface of the cover 18 of the LGA module 10.

With the LGA module 10 clamped against the circuit card 32, a cooling or heating fluid is circulated through the clamping body 54 to bring the LGA module 10 under test to a desired temperature. Electrical testing, or burn-in of the module is then completed.

When testing or burn-in of the LGA module 30 is completed, the air cylinder 44 retracts the piston rod 76 and self-aligning clamping device 34 to a position, as shown in FIG. 3, allowing easy access for removing the LGA module 10 from the interposer 20. Periodically, the interposer 20 can be replaced to maintain optimal electrical contact between the LGA module 10 and the circuit card 32.

Those having skill in the art will recognize that a test apparatus 30 according to our invention allows high volume precision testing and burn-in of LGA modules 10 in a standardized manner, using a mounting arrangement that closely approximates the mounting and environmental conditions that the LGA module 10 will encounter in service. While the embodiments of our invention disclosed herein are presently considered to be preferred, various changes and modifications can be made without departing from the spirit and scope of the invention. The scope of the invention is indicated in the appended claims. All changes or modifications within the meaning and range of equivalents are embraced by the claims.

We claim:

1. An apparatus for testing a land grid array (LGA) module having a flat planar mounting surface including a plurality of LGA electrical contacts arranged in an array, the apparatus comprising:
   a support frame;
   a circuit card having a flat planar surface attached to the support frame and having an array of electrical test contacts corresponding to a portion of the array of LGA electrical contacts disposed on the planar surface;
   a ram element operatively attached to the support frame for selectively applying a clamping force through reciprocating movement of the ram element along a ram axis oriented generally normal to the array of electrical contacts on the flat planar surface of the circuit card; and
   a self-aligning clamping device for clamping the LGA module against the circuit card;
   the self-aligning clamping device including a clamping body having an LGA contact surface adapted for bearing against the LGA module, and a pivot element operatively attached to the ram element for receiving the clamping force and transferring the clamping force to the clamping body.

2. The apparatus of claim 1 wherein the pivot element provides a single point of contact for transferring the clamping force to the clamping body.

3. The apparatus of claim 1 wherein the array of LGA electrical contacts defines a centroid of the array of LGA electrical contacts, and the pivot element applies the clamping force along a primary line of force that is directed through the centroid.

4. The apparatus of claim 1 further including an interposer positioned on the circuit card for receiving the LGA module.

5. The apparatus of claim 4 further including a positioning frame for positioning the interposer and LGA module on the circuit card.

6. The apparatus of claim 1, further including a positioning frame for positioning the LGA module on the circuit card for receiving the LGA module.

7. The apparatus of claim 1 further including a force generating device operatively connected through the ram element to the pivot element for applying the clamping force to the clamping body.

8. The apparatus of claim 1 wherein the clamping body is a heat exchanger for exchanging heat with the LGA module.

9. The apparatus of claim 1 wherein the self-aligning clamping device brings the LGA contact surface of the clamping body to bear against the LGA module and aligns the LGA contact surface with the LGA module prior to the clamping body receiving and transferring the clamping force to the LGA module.

10. The apparatus of claim 9 wherein the self-aligning clamping device further includes:
    a suspension plate adapted for receiving the clamping force, and having a first pivot element extending therefrom;
    a second pivot element attached to the clamping body;
    one or more suspension posts slidingly connecting the clamping body to the suspension plate in a spaced relationship therewith allowing angular movement over a predetermined range of the clamping body with respect to the suspension plate; and
    one or more spring elements operatively connected between the suspension plate and clamping body for maintaining the spaced relationship while allowing angular movement within the predetermined range between the clamping body and suspension plate.

11. The apparatus of claim 10 wherein the first pivot element has a convex spherical shape, and the second pivot element is a flat plate.

12. The apparatus of claim 10 wherein:
    the spring elements exert an alignment force acting between the suspension plate and the clamping body; and the spaced relationship between the spring plate and clamping body is such that the first and second pivot elements do not contact one another until a clamping force large enough to overcome the alignment force is applied to the suspension plate.

13. The apparatus of claim 12 wherein the first pivot element has a convex spherical shape, and the second pivot element is a flat plate.

14. A method for testing a land grid array (LGA) module having a flat planar mounting surface including a plurality of LGA electrical contacts arranged in an array, the method comprising:

positioning the LGA module on a circuit card having an array of electrical test contacts corresponding to a portion of the array of LGA electrical contacts; and clamping the LGA module against the circuit card with a self-aligning clamping device including a clamping body having an LGA contact surface adapted for bearing against the LGA module, and a pivot element for receiving a clamping force from a ram element selectively movable along a ram axis oriented generally normal to the array of electrical test contacts on the circuit card and transferring the clamping force to the clamping body.

15. The method of claim 14 wherein the pivot element provides a single point of contact for transferring the clamping force to the clamping body, and the method further comprises transferring the clamping force to the clamping body through the pivot element.

16. The method of claim 15 wherein the array of LGA electrical contacts defines a centroid of the array of LGA electrical contacts, and the method further comprises applying the clamping force through the pivot element along a primary line of force that is directed through the centroid.

17. The method of claim 14, further comprising clamping an interposer between the circuit card and the LGA module.

18. The method of claim 14, further comprising exchanging heat with the LGA module through the clamping body while performing electrical testing of the LGA module.

19. An apparatus for testing a land grid array (LGA) module having a flat planar mounting surface including a plurality of LGA electrical contacts arranged in an array, the apparatus comprising:

a circuit card having an array of electrical test contacts corresponding to a portion of the array of LGA electrical contacts; and a self-aligning clamping device for clamping the LGA module against the circuit card, the self-aligning clamping device including a clamping body having an LGA contact surface adapted for bearing against the LGA module, and a pivot element adapted for receiving a clamping force from a ram element selectively movable along a ram axis oriented generally normal to the array of electrical test contacts on the circuit card and transferring the clamping force to the clamping body.

20. The apparatus of claim 19, further comprising a heat exchanger for exchanging heat with the LGA module through the clamping body while performing electrical testing of the LGA module.

* * * * *